United States Patent
Kajihara

(10) Patent No.: US 8,719,741 B2
(45) Date of Patent: May 6, 2014

(54) GUARDING LOGIC INSERTING METHOD BASED ON GATED CLOCK ENABLE SIGNALS

(75) Inventor: Hirotsugu Kajihara, Yokohama (JP)

(73) Assignee: Kabushiki Kaisha Toshiba, Tokyo (JP)

(*) Notice: Subject to any disclaimer, the term of this patent is extended or adjusted under 35 U.S.C. 154(b) by 94 days.

(21) Appl. No.: 12/883,835

(22) Filed: Sep. 16, 2010

(65) Prior Publication Data

US 2011/0010681 A1    Jan. 13, 2011

Related U.S. Application Data

(62) Division of application No. 11/684,727, filed on Mar. 12, 2007, now Pat. No. 7,818,602.

(30) Foreign Application Priority Data

Mar. 13, 2006  (JP) .................................. 2006-068071

(51) Int. Cl.
    *G06F 9/45*     (2006.01)
    *G06F 9/455*    (2006.01)
    *G06F 17/50*    (2006.01)

(52) U.S. Cl.
    USPC ............. 716/103; 716/101; 716/102; 716/133

(58) Field of Classification Search
    None
    See application file for complete search history.

(56) References Cited

U.S. PATENT DOCUMENTS

| | | | |
|---|---|---|---|
| 5,793,672 A | 8/1998 | Wong et al. | |
| 6,822,478 B2 | 11/2004 | Elappuparackal | |
| 6,831,482 B2 * | 12/2004 | Cunningham et al. | 326/93 |
| 6,976,232 B2 * | 12/2005 | Cunningham et al. | 716/103 |
| 7,003,683 B2 | 2/2006 | Muroor | |
| 7,245,168 B2 | 7/2007 | Rhee | |
| 7,478,214 B2 | 1/2009 | Kaburlasos | |
| 2002/0188911 A1 | 12/2002 | Asai | |
| 2004/0004504 A1 * | 1/2004 | Cunningham et al. | 327/215 |
| 2004/0015790 A1 * | 1/2004 | Cunningham et al. | 716/3 |
| 2006/0236278 A1 | 10/2006 | Shimony | |
| 2007/0006105 A1 | 1/2007 | Bartling et al. | |

FOREIGN PATENT DOCUMENTS

| | | |
|---|---|---|
| JP | 11-149496 | 6/1999 |
| JP | 2002-010073 | 1/2002 |
| JP | 2002-092065 | 3/2002 |
| JP | 2003-067433 | 3/2003 |
| JP | 2003-109382 | 4/2003 |

OTHER PUBLICATIONS

Nithya Raghavan, et al., "Automatic Insertion of Gated Clocks at Register Transfer Level", Proceedings of the Twelfth International Conference on VLSI Design, 1999, 7 pages.

(Continued)

*Primary Examiner* — A. M. Thompson
(74) *Attorney, Agent, or Firm* — Oblon, Spivak, McClelland, Maier & Neustadt, L.L.P.

(57) ABSTRACT

A semiconductor integrated circuit device is disclosed. The semiconductor integrated circuit device includes a first circuit whose output never or seldom changes when the output from an Enable generator is off, a second circuit whose output frequently changes, an input controller which receives the respective outputs from the second circuit and the Enable generator and passes through the input from the second circuit only when the output from the Enable generator is on, a combination circuit which receives the respective outputs from the first circuit and the input controller, and a memory which receives the output from the combination circuit and is driven by the output from the clock controller.

5 Claims, 11 Drawing Sheets

Ninth Embodiment

(56) References Cited

OTHER PUBLICATIONS

Vivek Tiwari, et al., Guarded Evaluation: "Pushing Power Management to Logic Synthesis/Design", IEEE Transactions on Computer-Aided Design of Integrated Circuits and Systems, vol. 17, No. 10, Oct. 1998, pp. 1051-1060.

Office Action issued on Jan. 4, 2011, in Japanese Patent Application No. 2006-068071 (with English Translation).

* cited by examiner

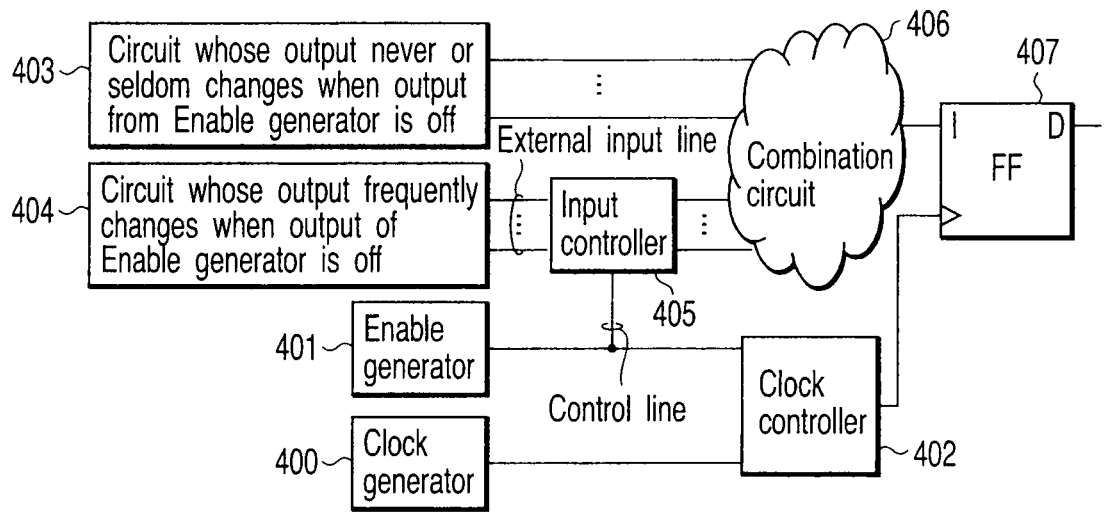
F I G. 1
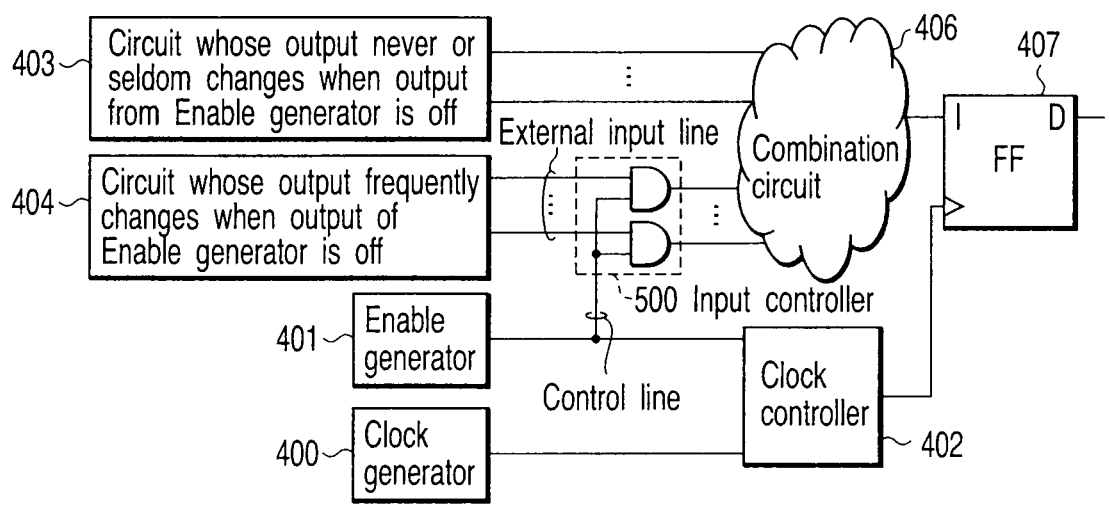
F I G. 2

Fifth Embodiment

Seventh Embodiment

Eighth Embodiment

Circuit example 2 of tenth embodiment

Eleventh Embodiment

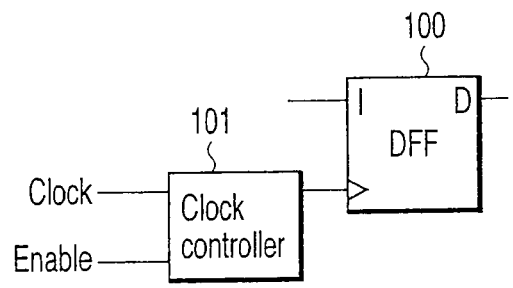
Gated clock circuit
FIG. 17
*Prior Art*
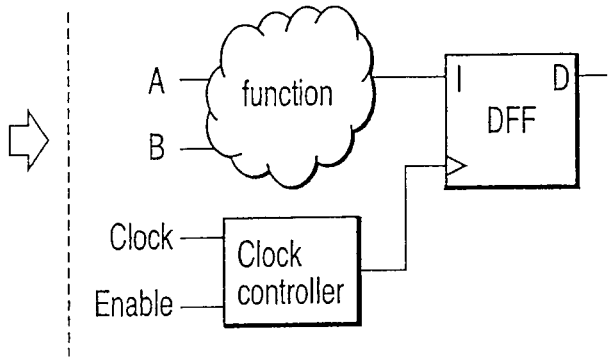
FIG. 18A
*Prior Art*
FIG. 18B
*Prior Art*

Situation of gated clock method

Guarding logic circuit

GUARDING LOGIC INSERTING METHOD BASED ON GATED CLOCK ENABLE SIGNALS

CROSS-REFERENCE TO RELATED APPLICATIONS

This application is a divisional of U.S. application Ser. No. 11/684,727 filed Mar. 12, 2007, now U.S. Pat. No. 7,818,602 and is based upon and claims the benefit of priority from prior Japanese Patent Application No. 2006-068071, filed Mar. 13, 2006, the entire contents of which are incorporated herein by reference.

BACKGROUND OF THE INVENTION

1. Field of the Invention

This invention relates to a semiconductor integrated circuit device and its circuit inserting method.

2. Description of the Related Art

It is a waste of power to clock drive a flip flop having no change of value and a flip flop whose output is not used for another circuit. As a method for solving this problem, a gated clock method is well known.

A schematic gated clock circuit is shown in FIG. 17. As shown in FIG. 17, the schematic gated clock circuit includes a D-type flip flop (hereinafter, it is referred to as DFF) 100 and a clock controller 101 which controls a clock line for driving the DFF. The clock controller 101 is a control circuit which transmits a clock to the DFF 100 only when an Enable signal is turned on. By turning on the Enable signal only when update of a value in the DFF is desired, power consumption can be saved.

The conventional gated clock method controls clock signals by the unit of module or in every clock domain in many cases, while in these days, they are gated-controlled minutely in every flip flop (hereinafter, referred to as FF) in order to reduce the power consumption as much as possible. This is not only to reduce the driving power of a buffer and the FF by the clock, but also to stop a wasteful driving of a combination circuit existing on the subsequent stage of the FF. An example is shown in FIGS. 18A and 18B. FIG. 18A shows an RTL (Register Transfer Level) description and FIG. 18B shows an example of a gated clock circuit according to the RTL description shown in FIG. 18A. A code shown in FIG. 18A is the RTL description for updating D only when the Enable signal is 1. The RTL is realized by the gated clock circuit as shown in FIG. 18B. By forming each FF included in the circuit as shown in FIG. 18B, it is possible to gated-control the circuit minutely in every FF. At this time, there is the following situation.

It will be described referring to FIG. 19. The circuit shown in FIG. 19 is formed by: a first DFF 200, a first combination circuit 201 to determine the value of the first DFF 200, and a first clock controller 202; a second DFF 203, a second combination circuit 204 to determine the value of the second DFF 203, and a second clock controller 205; a third DFF 206, a third combination circuit 207 to determine the value of the third DFF 206 and a third clock controller 208. The output of the first DFF 200 is connected to the second combination circuit 204 and the third combination circuit 207.

Assume that the first DFF 200 and the second DFF 203 are driven and that the third DFF 206 is stopped. That is, the first clock controller 202 and the second clock controller 205 turn on the Enable signals, and the third clock controller 208 turns off the Enable signal. As the result, the third DFF 206 and the third clock controller 208 stop their operations. However, the third combination circuit 207 to determine the value of the third DFF 206 is driven according to a change of the first DFF 200. It is wasteful that the third combination circuit 207 is driven while the third DFF 206 is stopped.

As mentioned above, when a plurality of clock domains exist, according to the gated clock technique, wasteful power may be consumed in the combination circuit portion.

As a reference about the gated clock technique, there is "Automatic Insertion of Gated Clocks at Register Transfer Level, N. Raghavan, V. Akella, S. Bakshi, Proceedings of the Twelfth International Conference on VLSI Design, 1999, pp. 48-54".

Upon receipt of an input change, the combination circuit is driven and consumes power. Therefore, the power consumption may be reduced in the combination circuit by suppressing a wasteful input change. As the method for solving this situation, there is a guarding logic method.

A schematic guarding logic circuit is shown in FIG. 20. As shown in FIG. 20, the schematic guarding logic circuit is formed by a combination circuit 300 and an input control circuit 301 which controls an input line to the combination circuit 300. When the Enable signal is turned on, the input control circuit 301 transmits the inputs to the combination circuit 300 as they are, and when the Enable signal is turned off, it does not transmit the inputs to the combination circuit 300. Only when the outputs of the combination circuit 300 are used, the Enable signal is turned on in the input control circuit 301, hence to prevent a wasteful drive of the combination circuit 300.

When the guarding logic method is adopted, the following situations occur as a result of inserting the input control circuit 301: 1. increase of delay; 2. upsizing of circuit; and 3. necessity of an Enable signal generation circuit. They are serious problems because the increase of delay has a major effect on the operation speed of the circuit and the upsizing of circuit has a major effect on production cost of an LSI.

As a reference about the guarding logic method, there is "Guarded Evaluation: Pushing Power Management to Logic Synthesis/Design, V. Tiwari, S. Malik, P. Ashar, IEEE Transactions on Computer-Aided Design of Integrated Circuits and Systems, Vol. 17, No. 10, October 1998".

BRIEF DESCRIPTION OF THE SEVERAL VIEWS OF THE DRAWING

FIG. 1 is a block diagram showing an example of a semiconductor integrated circuit device according to a first embodiment of the invention;

FIG. 2 is a block diagram showing an example of a semiconductor integrated circuit device according to a second embodiment of the invention;

FIG. 17 is a circuit diagram showing a schematic gated clock circuit;

FIG. 18A shows a RTL description and FIG. 18B shows an example of a gated clock circuit according to the RTL description shown in FIG. 18A;

DETAILED DESCRIPTION OF THE INVENTION

Figure 19:
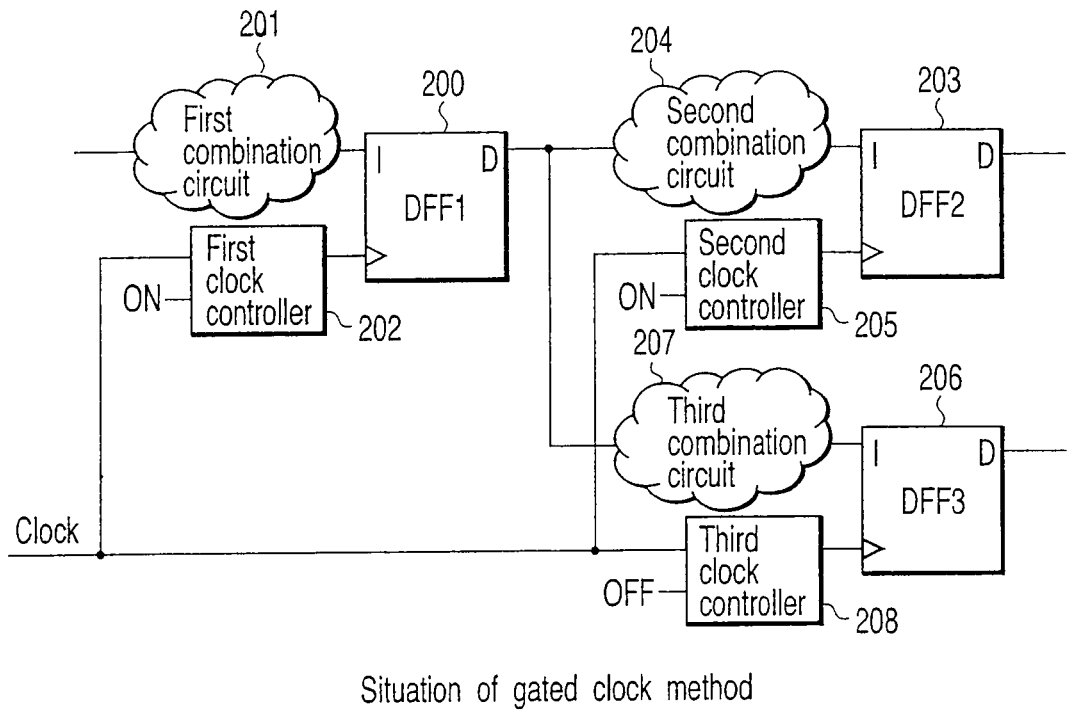
FIG. 19 is a drawing for use in describing the situation of the gated clock technique.
Figure 20:
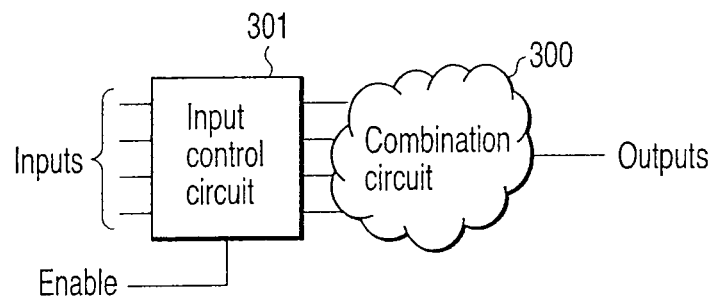
FIG. 20 is a circuit diagram showing a schematic guarding logic circuit.

The situations described referring to FIG. 19 may be solved by inserting a guarding logic synchronized with an Enable signal of a third clock controller 208 in a wiring between a first DFF 200 and a third combination circuit 207. When the Enable signal of the third clock controller 208 is turned off, an input to the third combination circuit 207 is stopped by the guarding logic. However, a tool which automatically generates the guarding logic at a proper position does not exist.

Hereinafter, embodiments of the invention will be described referring to the drawings. In the description and the drawings, the same reference numerals and symbols are attached to the same portions.

Semiconductor integrated circuit devices according to first to eighth embodiments may realize low power consumption.

The power consumption in an integrated circuit is given by "$W=CFV^2$", where C is a load capacity, V is a voltage, and F is a frequency or a logic transition number. As a method for suppressing the logic transition number, the gated clock technique is generally known. According to the invention, a control line of the gated clock in a resistor is used in order to fix the input of the combination circuit which generates the resistor input, at 0 or 1, thereby making it possible to completely prevent logic transition in the combination circuit during the gated clock period. By reducing "F" in "$W=CFV^2$", the low power consumption is realized.

(First Embodiment)

FIG. 1 is a block diagram showing an example of a semiconductor integrated circuit device according to a first embodiment of the invention.

The first embodiment includes a clock generator 400, an Enable generator 401 which outputs on/off, a clock controller 402 which receives the outputs from the clock generator 400 and the Enable generator 401, a circuit 403 whose output seldom changes when the output of the Enable generator 401 is off, a circuit 404 whose output frequently changes when the output of the Enable generator 401 is off, an input controller 405 which receives the outputs from the Enable generator 401 and the circuit 404, a combination circuit 406 which receives the outputs from the circuit 403 and the input controller 405, and a flip flop (hereinafter, it is abbreviated as FF) 407 which receives the output from the combination circuit 406 and is driven by the clock output from the clock controller 402. There may exist a plurality of the circuits 403 and the circuits 404 respectively.

Each unit will be described in detail.

Only when the output of the Enable generator 401 is on, the clock controller 402 transmits the clock signal generated in the clock generator 400 to the FF 407. When the output of the Enable generator 401 is off, the output of the clock controller 402 is a fixed value and the FF 407 is not driven.

When the output of the Enable generator 401 is on, the input controller 405 transmits the output of the circuit 404 to the combination circuit 406 as it is. When the output of the Enable generator 401 is off, the output of the input controller 405 is a fixed value, and even when the output of the circuit 404 changes, the combination circuit 406 is not driven.

When the output of the Enable generator 401 is off, the output of the circuit 403 never or seldom changes. Therefore, in the gated clock circuit which controls the signals minutely in every FF, wasteful drive is little in the combination circuit when the FF 407 is stopped.

On the other hand, the output of the circuit 404 changes frequently when the output of the Enable generator 401 is off. However, thanks to the operation of the input controller 405, an output change is not transmitted to the combination circuit 406 when the output of the Enable generator 401 is off. Therefore, in the gated clock circuit which controls the signals minutely in every FF, wasteful drive can be completely prevented in the combination circuit when the FF 407 is stopped.

The embodiment realizes a good effect that could not be obtained in the single method, through an effective combination of the gated clock method and the guarding logic method. This will be described below.

Comparison is made between the gated clock technique and the embodiment. Generally, the logic circuit has spatial localization and the prior/posterior processing and controls are highly related to each other. Therefore, in the gated clock circuit which controls the signals minutely in every FF, there is a high probability that the prior and posterior FFs may stop under the gated clock control, when a certain FF stops under the gated clock control. Therefore, circuits such as the circuit 403 are in the majority. However, since there exist some circuits such as the circuit 404, only the gated clock technique cannot stop the wasteful drive in the combination circuit. Then, the guarding logic method is used for only a portion in which the wasteful drive cannot be stopped. As the result, a circuit with higher power-reduction effect can be realized than that in the gated clock method.

When only the guarding logic method is used to stop the driving of the combination circuit, upsizing of a circuit and an increase of delay become serious problems because the guarding logics have to be arranged at all the inlets of the combination circuits. In the embodiment, since the greater part of the inputs can be stopped under the gated logic control, as mentioned above, it is not necessary to stop every inlet of the combination circuit. It is only necessary to stop only the input frequently causing an output change like the circuit 404 with the guarding logic. This is effective in suppressing an increase in size and delay in a circuit compared with the simple guarding logic method.

As above mentioned, in the embodiment, the power reduction effect is larger than that according to the gated clock only. This is because a switching which could not be stopped by only the gated clock can be stopped. Further, the circuit size is smaller than that according to the guarding logic only. This is because guarding logics can be saved in the unnecessary positions. The invention has so much effect for the number of the guarding logics compared with the case of individually performing the gated clock method or the guarding logic method.

(Second Embodiment)

FIG. 2 is a block diagram showing an example of a semiconductor integrated circuit device according to a second embodiment of the invention.

The second embodiment is a first example specifically showing the input controller 405 according to the first embodiment.

The input controller 405 may be formed, for example, by an AND gate (reference numeral 500). Each external input line is connected to the combination circuit 406 after passing through each AND gate connected to the control line in every bit line.

When the control line is 0, the AND gates are turned off, to fix the output of the input controller 500 at 0. When the control line is 1, they are turned on, to set the output of the input controller 500 as the external input.

In this way, since the input controller 500 may be realized by only the AND gates, the influence on a critical path can be suppressed to the delay for one stage of the gates.

In addition, by using the De Morgan's theorem, it may be realized by only OR gates.

In an integrated circuit, since the AND gates and the OR gates are basic elements, the circuit area and the path delay are small.

(Third Embodiment)

Figure 3:
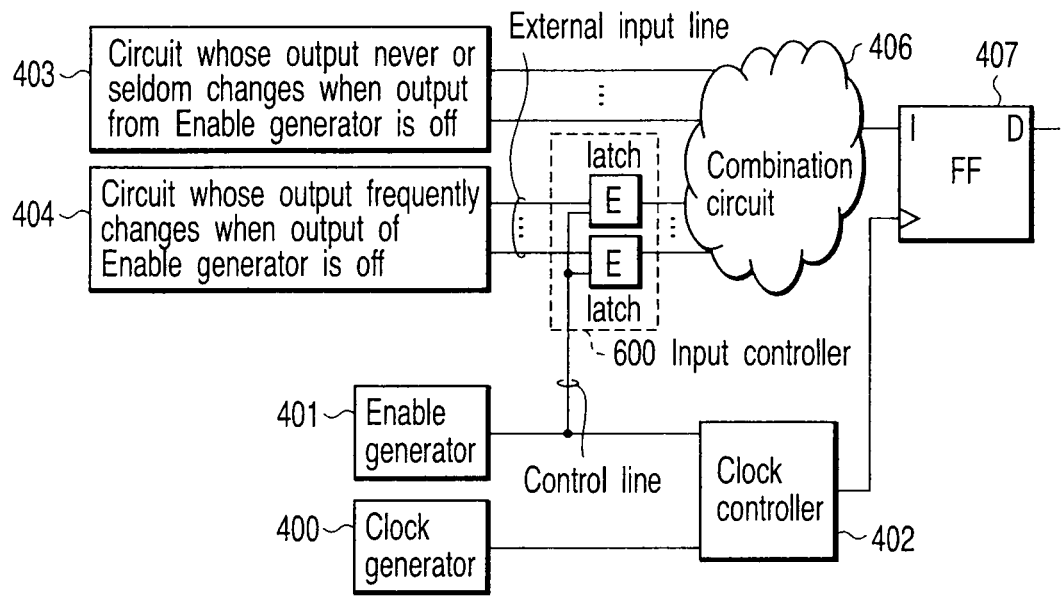
FIG. 3 is a block diagram showing an example of a semiconductor integrated circuit device according to a third embodiment of the invention.

FIG. 3 is a block diagram showing an example of a semiconductor integrated circuit device according to a third embodiment of the invention.

The third embodiment is a second example specifically showing the input controller 405 according to the first embodiment.

The input controller 405 may be formed, for example, by a latch circuit with Enable signal (reference numeral 600). The latch circuit with Enable signal is controlled by the control line. The respective external input lines are connected to the combination circuit 406 after passing through the respective latch circuits.

When the control line is 0, the latch circuits with Enable signal are turned off, to set the output of the input controller 600 at the latest external input value. When the control line is 1, they are turned on, to set the output of the input controller 600 as the external input.

In order to show the effect of the third embodiment, it will be compared with the second embodiment. In the second embodiment, the output (value) of the input controller 500 is fixed at 0 by the AND gate. At this time, the input of the combination circuit 406 is switched from the external input to 0. Therefore, the switching operation occurs in the combination circuit 406 at the time of fixing the value in the input controller 500, hence to consume the power.

On the other hand, in the case of the third embodiment, the latch circuit with Enable signal fixes the output of the input controller 600 at the external input value. Therefore, the switching operation does not occur in the combination circuit 406 at the time of fixing the value. The third embodiment can save the power consumption at the time of fixing the value more than the second embodiment.

(Fourth Embodiment)

Figure 4:
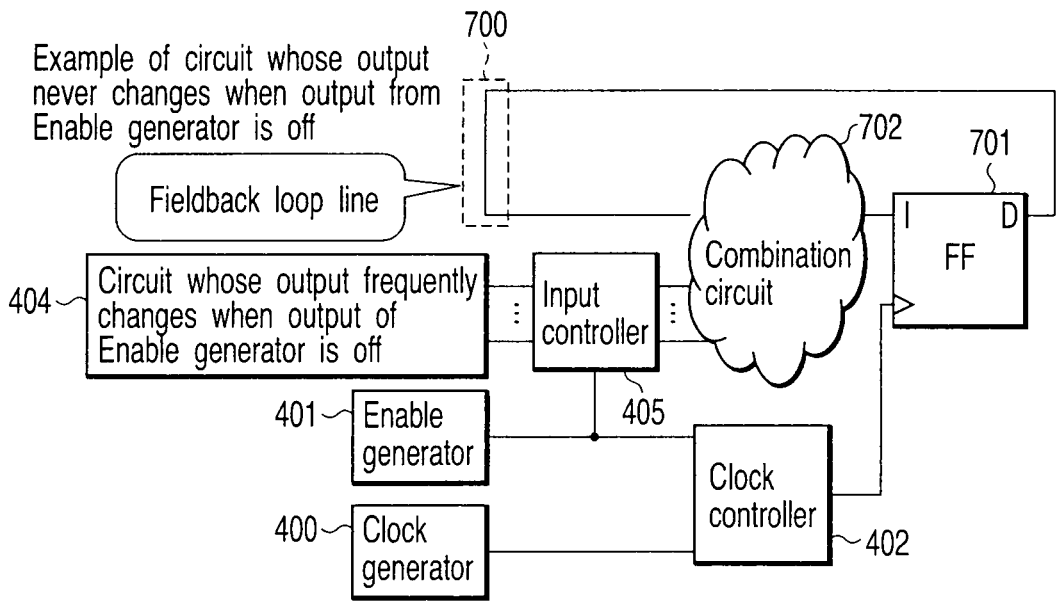
FIG. 4 is a block diagram showing an example of a semiconductor integrated circuit device according to a fourth embodiment of the invention.

FIG. 4 is a block diagram showing an example of a semiconductor integrated circuit device according to a fourth embodiment of the invention.

The fourth embodiment is a first example specifically showing the circuit 403 whose output never or seldom changes when the output of the Enable generator 401 according to the first embodiment is off.

A broken line frame 700 in FIG. 4 shows an example of a circuit whose output does not change when the output of the Enable generator 401 is off. This example has the circuit structure (feedback loop line) in which the output of the FF 701 is supplied to the combination circuit 702 as it is without change. When the output of the Enable generator 401 is off, since the FF 701 is not driven, the frequency of the output change becomes 0.

In this circuit structure that is the self-feedback loop, it is not necessary to insert the input controller 405.

As a typical circuit of the fourth embodiment, there are "a counter circuit" and "a state machine circuit".

The counter circuit is to update the resistor value by adding 1 to the own resistor value. In the RTL (Register Transfer Level) description, it is described as follows:

always@ (posedge CLOCK){A<=A+1;}.

The state machine circuit is to update the current state through calculation of the resistor value of a next state from the current state (resistor value) by a next state determining circuit (combination circuit). In the RTL description, it is described as follows:

--- assign NextState = function (CurrentState); < < <
combination circuit
always@ (posedge CLOCK){CurrentState <= NextState;}

---

The structure of these circuits may be estimated from the RTL description. Therefore, in the counter circuit and the state machine circuit, the feedback loop line 700 shown in FIG. 4 can be specified easily. It is not necessary to set the input controller 405 in the feedback loop line 700. In other words, the input controller 405 may be set in any other portion than the feedback loop line 700.

In this way, it is easy to find especially the feedback loop line 700 in the integrated circuit. Since the input controller 405 may be inserted into any other portion than the feedback loop line 700, it is easy to mount the circuit on a semiconductor chip.

(Fifth Embodiment)

Figure 5:
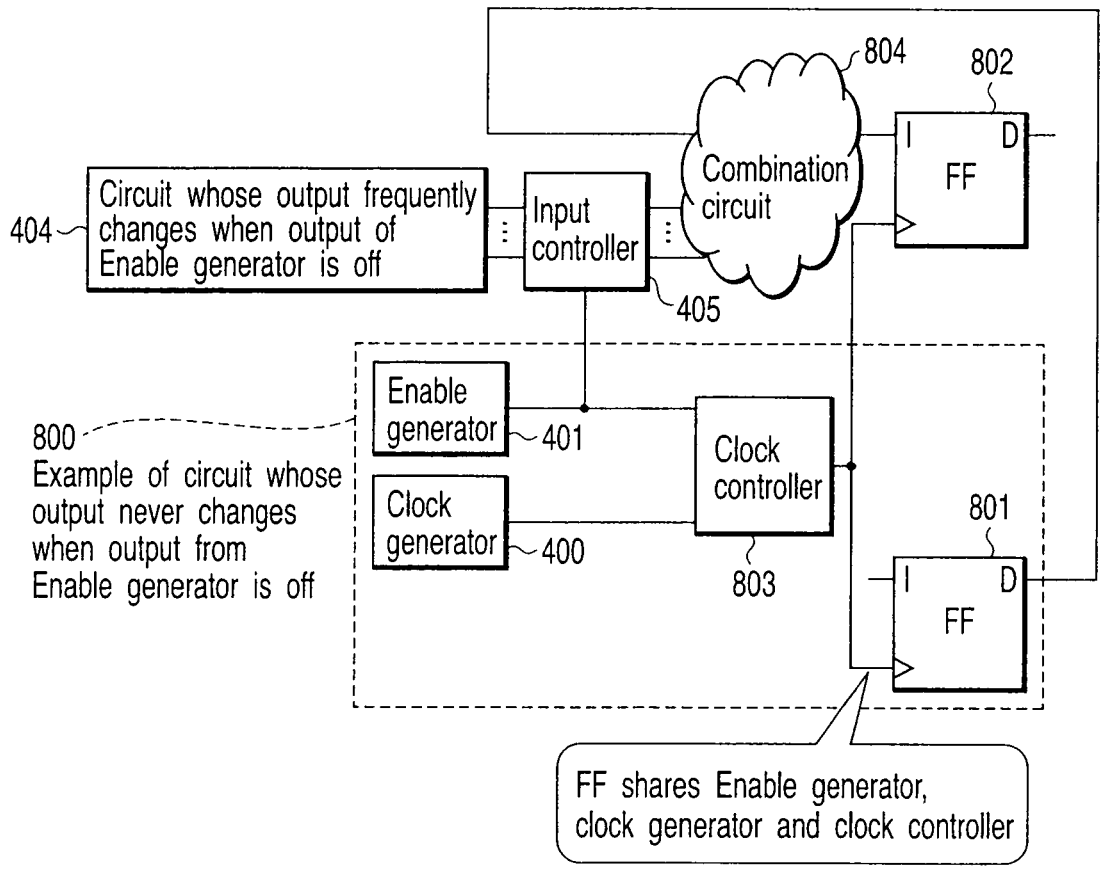
FIG. 5 is a block diagram showing an example of a semiconductor integrated circuit device according to a fifth embodiment of the invention.

FIG. 5 is a block diagram showing an example of a semiconductor integrated circuit device according to a fifth embodiment of the invention.

The fifth embodiment is a second example specifically showing the circuit 403 whose output never or seldom changes when the output of the Enable generator 401 according to the first embodiment is off.

A broken line frame 800 in FIG. 5 shows the example of the circuit whose output does not change when the output of the Enable generator 401 is off. An FF 801 and an FF 802 share a clock controller 803. Since the output of the FF 801 also stops when the FF 802 stops driving, the frequency of the output change becomes 0. Therefore, a combination circuit 804 is not driven.

In this way, it is not necessary to arrange the input controller 405 on the output side from the circuit 800 which shares the clock controller 803.

Also in the circuit structure of the fifth embodiment, it is easy to find the circuit 800 similarly to the fourth embodiment, and it is also easy to mount the circuit on a semiconductor chip.

(Sixth Embodiment)

Figure 6:
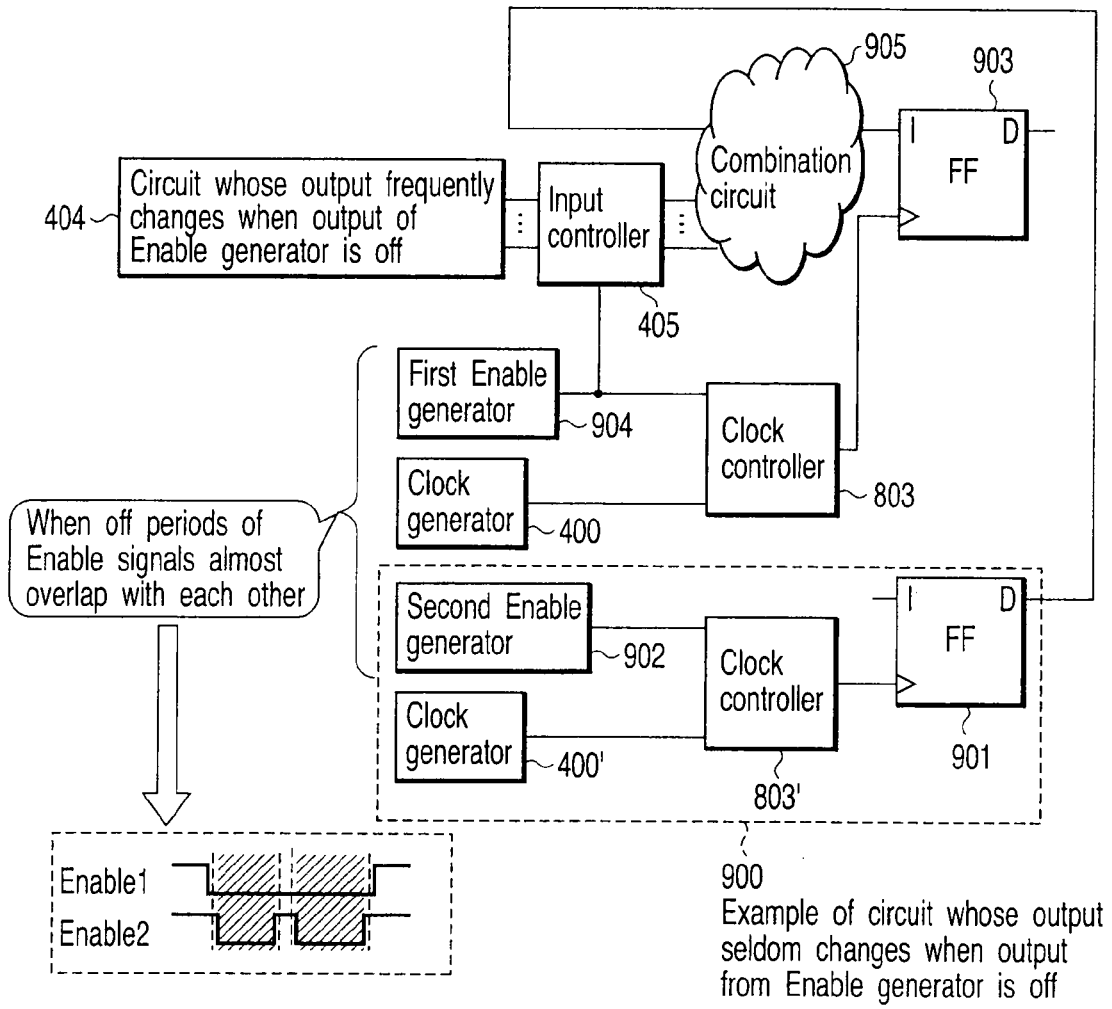
FIG. 6 is a block diagram showing an example of a semiconductor integrated circuit device according to a sixth embodiment of the invention.

FIG. 6 is a block diagram showing an example of a semiconductor integrated circuit device according to a sixth embodiment of the invention.

The sixth embodiment is a third example specifically showing the circuit 403 whose output never or seldom changes when the output of the Enable generator 401 according to the first embodiment is off.

A broken line frame 900 in FIG. 6 shows the example of the circuit whose output seldom changes when the output of an Enable generator 902 is off. When a timing of the Enable signal generated by a second Enable generator 902 which controls an FF 901 and a timing of the Enable signal generated by a first Enable generator 904 which controls an FF 903 are close to each other, the frequency of the output change of the FF 901 is reduced.

For example, as shown in the broken line frame at the lower left of FIG. 6, when the signal Enable 2 is almost off during the period when the signal Enable 1 is off, the FF 901 almost stops driving when the FF 903 stops driving. Therefore, the circuit 900 may be the circuit having less output change.

When the off periods of the signals Enable overlap with each other, it is not necessary to insert the input controller 405.

This circuit structure may be found by manpower. Alternatively, whether the overlapping stage of the off periods exceeds a threshold or not may be checked through the RTL simulation and a comparison between the operation of the first Enable generator 904 and the operation of the second Enable generator 902, hence to determine whether the input controller 405 is inserted or not. For example, when the overlapping degree exceeds 50% and more, the input controller 405 is not inserted.

(Seventh Embodiment)

Figure 7:
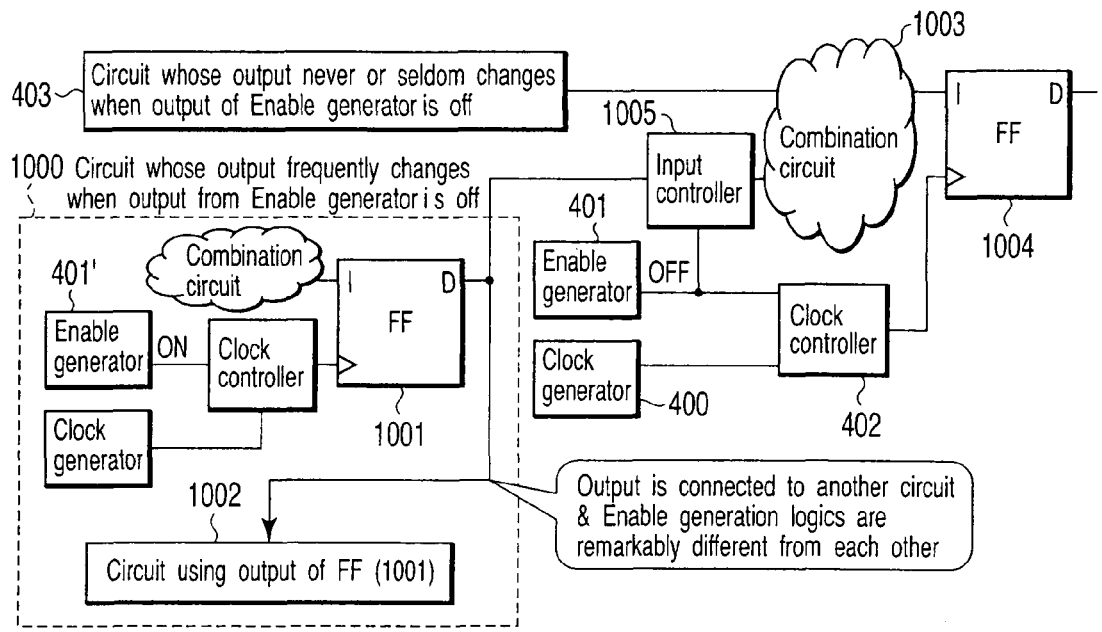
FIG. 7 is a block diagram showing an example of a semiconductor integrated circuit device according to a seventh embodiment of the invention.

FIG. 7 is a block diagram showing an example of a semiconductor integrated circuit device according to a seventh embodiment of the invention.

The seventh embodiment is a first example specifically showing the circuit 404 whose output frequently changes when the output of the Enable generator 401 according to the first embodiment is off.

A broken line frame 1000 shown in FIG. 7 shows the circuit whose output frequently changes when the output of the Enable generator 401 is off. An output D of an FF 1001 shown in FIG. 7 is connected to a circuit 1002. The output D of the FF 1001 is connected to a combination circuit 1003 through an input controller 1005. At this time, even when an Enable signal of an FF 1004 is off, since the circuit 1002 uses the output of the FF 1001, an Enable generator 401' of the FF 1001 is turned on. As a result, the frequency of the output change in the FF 1001 is high when the Enable of the FF 1004 is off. In order to reduce the wasteful driving in the combination circuit 1003, the input controller 1005 is inserted.

In this way, when the output of the FF is connected to another circuit and the logics of the Enable generators are remarkably different from each other, the input controller 1005 is inserted.

This circuit structure may be found by manpower. Alternatively, whether the different degree of the off periods exceeds a threshold or not may be checked through the RTL simulation and a comparison between the operation of the Enable generator 401 and the operation of the Enable generator 401', hence to determine whether the input controller is inserted or not. For example, when the different degree is 50% and more, the input controller 1005 is not inserted.

(Eighth Embodiment)

Figure 8:
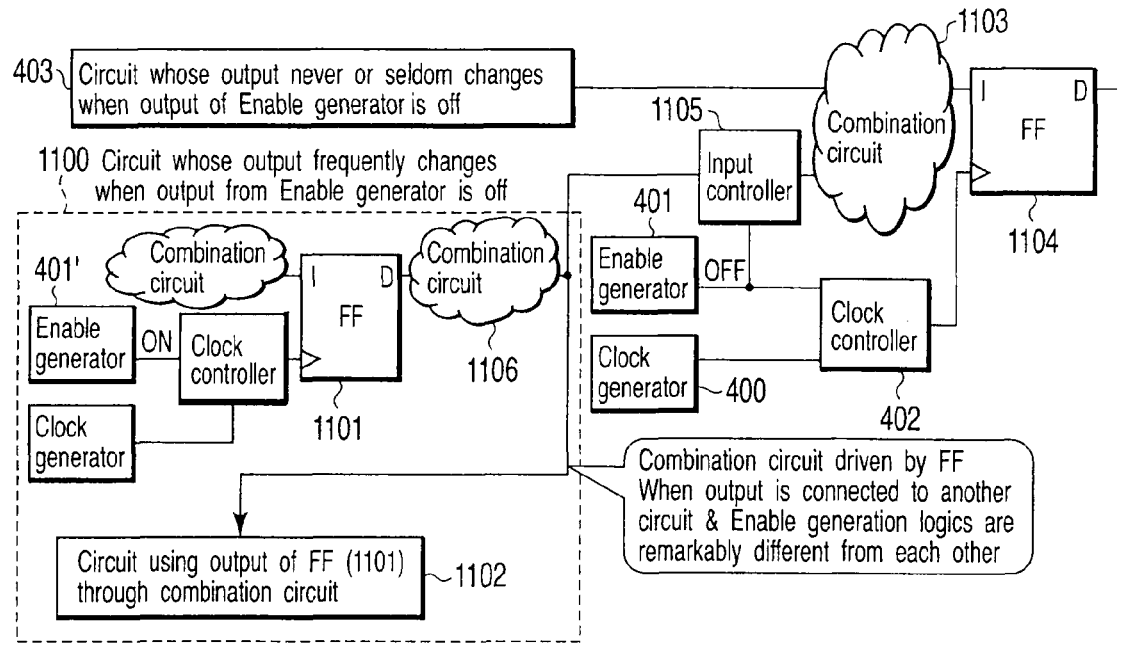
FIG. 8 is a block diagram showing an example of a semiconductor integrated circuit device according to an eighth embodiment of the invention.

FIG. 8 is a block diagram showing an example of a semiconductor integrated circuit device according to an eighth embodiment of the invention.

The eighth embodiment is a second example specifically showing the circuit 404 whose output frequently changes when the output of the Enable generator 401 according to the first embodiment is off.

A broken line frame 1100 shown in FIG. 8 shows the circuit 404 whose output frequently changes when the output of the Enable generator 401 is off. Though the eighth embodiment has almost the same structure as the seventh embodiment, the output of an FF 1101 is connected to a circuit 1102 through a combination circuit 1106 and connected to a combination circuit 1103. At this time, even when the Enable signal of an FF 1104 is off, the circuit 1102 uses the output of the FF 1101 through the combination circuit 1106. Therefore, the Enable generator 401' of the FF 1101 is turned on. As a result, the frequency of the output change is high when the Enable signal of the FF 1104 is off. In order to reduce the wasteful driving in the combination circuit 1103, the input controller 1105 is inserted between the combination circuit 1106 and the combination circuit 1103.

When the output of the FF is connected to another circuit through the combination circuit and the logics of the Enable generators are remarkably different from each other, the input controller 1105 is inserted.

This circuit structure may be found by manpower. Alternatively, whether the different degree of the off periods exceeds a threshold or not may be checked through the RTL simulation and a comparison between the operation of the Enable generator 401 and the operation of the Enable generator 401', hence to determine whether the input controller is inserted or not. For example, when the different degree exceeds 50% and more, the input controller 1005 is not inserted.

The semiconductor integrated circuit devices according to ninth to thirteenth embodiments relate to a system with a power consumption reduction circuit added to the gate net list after logic synthesis in a logic circuit.

When the gated clock is performed in every FF minutely, there is the case where even though the FF stops, the combination circuit is driven wastefully according to a change of the input in the combination circuit which determines the value of the FF. As the method for solving this situation, the guarding logic method exists. By the simple use of the guarding logic method, however, the circuit size is much enlarged.

The following embodiments are to provide a method for effectively inserting the guarding logic in the gate net list designed by the gated clock in every FF. More specifically, a connection structure of the gate net is analyzed and the guarding logic is inserted into only a necessary position.

(Ninth Embodiment)

Figure 9:
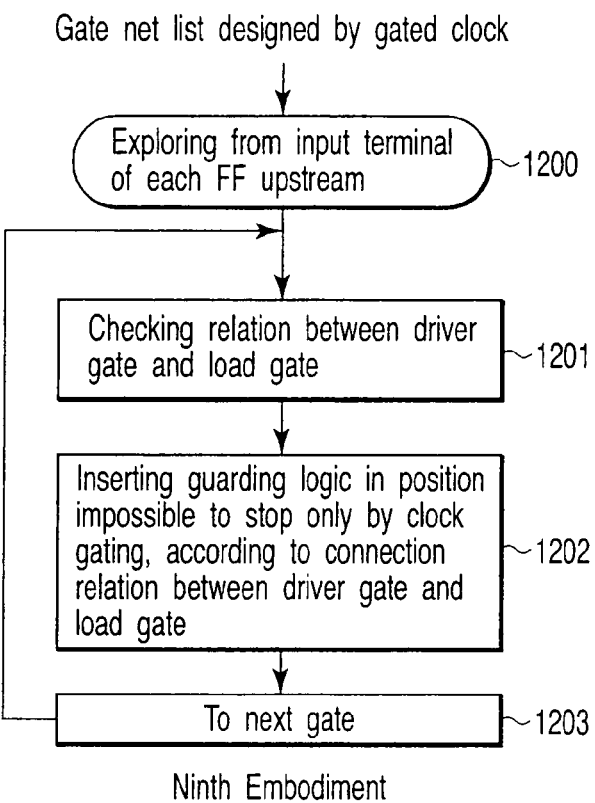
FIG. 9 is a flow chart showing an example of a circuit inserting method according to a ninth embodiment of the invention.

FIG. 9 is a flow chart showing an example of a circuit inserting method according to a ninth embodiment of the invention.

In the ninth embodiment, basically, the gate net list is entered, a tree structure of the circuit is explored upstream from the data input terminals of the respective FFs as the starting point, and the guarding logic is inserted in the front stage of the combination circuit in which the wasteful driving cannot be stopped only by the gated clock.

As described in the second and third embodiments, the guarding logic may be realized by the AND gate or the OR gate or the latch circuit with Enable signal. The guarding logic is controlled according to the on/off operation by the Enable line for clock control of the FFs as the starting point.

Before describing the operation according to the flow chart shown in FIG. 9, terms are defined at first.

FIGS. 10A to 10D are the circuit diagrams showing the relation between the gates and the insertion example of the guarding logic.

In the circuits shown in FIGS. 10A to 10D, the left side is defined as upstream and the right side is defined as downstream.

Figures 10A, 10B, 10C, 10D:
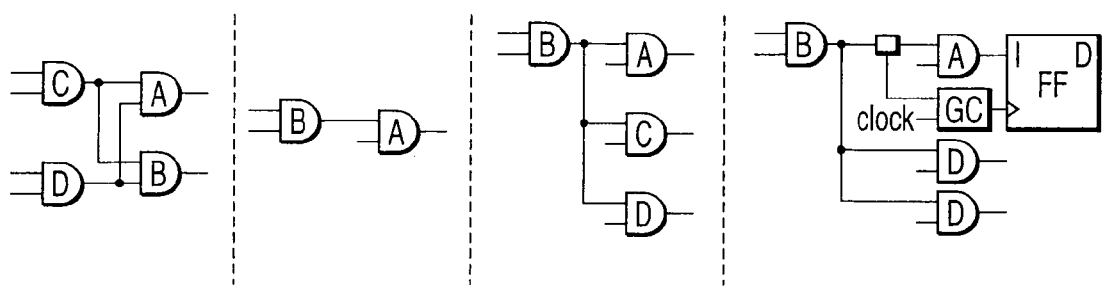
FIGS. 10A to 10D are circuit diagrams each showing a relation between gates and an insertion example of a guarding logic.

A gate which exists upstream to drive a certain gate is called a driver gate and a gate which exists downstream of a certain driving gate is called a load gate. In FIG. 10A, the driver gates of the gate A are the gates C and D. The load gates of the gate C are the gates A and B.

The relation between the driver gate and the load gate will be defined as follows. The relation in FIG. 10B is considered. The gate B is the driver gate of the gate A and the load gate of the gate B is only the gate A. Such the relation is called "one to one relation from the view of the gate A".

The relation in FIG. 10C is considered. The gate B is a driver gate of the gate A, and the gates A, C and D exist as the load gate of the gate B. This relation is called as "one to many relation from the view of the gate A".

The operation according to the flow chart shown in FIG. 9 will be described.

The gate net list designed by the gated clock is entered and the tree structure of the circuit is explored upstream for each FF within the net list from the data input terminals of the FFs as the starting point (process 1200).

Next, the relation between the driver gate and the load gate from the view of the gate which is found in the tree structure is checked (process 1201).

The case of the one to many relation from the view of the found gate is considered. At this time, in the case of the structure in which the switching of the downstream combination circuit cannot be stopped only by the gated clock method, the guarding logic is inserted in the front stage of the combination circuit (process 1202).

For example, in FIG. 10D, the gate B is in the one to many relation from the view of the gate A. When the FF is stopped by the gated clock, the switching of the gate A is wasteful. However, when the gates C and D use the output of the gate B, the gate B performs the switching. Therefore, the output line of the gate B is connected to the gate A through the guarding logic. The output of the gate B is kept connected to the gates C and D. The control line of the guarding logic at this time uses a clock Enable line of the FF as the starting point for explore. Upon completion of the processing, in the next gate (process 1203), the relation between the driver gate and the load gate is checked again.

In the case of the one to one relation from the view of the gate found, there is nothing to do and the next gate is checked. This is because the guarding logic control may be performed in the more upstream gate. For example, although it is necessary to stop the switching of the gate A in FIG. 10B, it is not necessary to set the guarding logic between the gate A and the gate B. This is because that it can be solved by setting the guarding logic in the front stage of the gate B.

The logic transition may be fundamentally stopped by inserting the guarding logic in a more upstream gate.

According to the above, the guarding logic can stop the portion in which the wasteful switching may occur in the combination circuit caused by the operation of the FF of the different clock domain, during the period when each FF is stopped by the gated clock.

In the following embodiments, "what condition" and "where is the guarding logic inserted" will be described referring to the specific examples.

(Tenth Embodiment)

Figure 11:
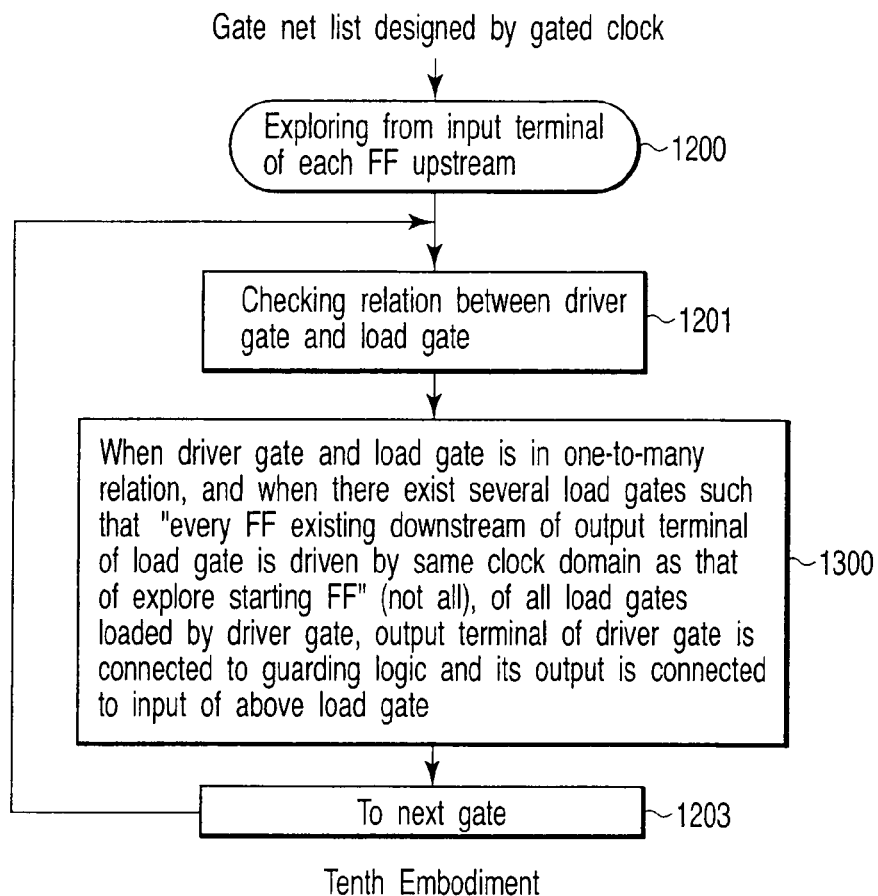
FIG. 11 is a flow chart showing an example of a circuit inserting method according to a tenth embodiment of the invention.

FIG. 11 is a flow chart showing an example of a circuit inserting method according to a tenth embodiment of the invention.

The tenth embodiment is an example specifically showing the condition for inserting the guarding logic of the ninth embodiment.

As shown in the process 1300 in FIG. 11, when the driver gate and the load gate are in the one to many relation, and when there exist one or more load gates such that "every FF existing in the downstream path of the output terminal of the load gate is driven by the same clock domain as that of the starting FF" (not all, and the case of all will be described later), of all the load gates loaded by the driver gate, the output terminal of the driver gate is connected to the guarding logic and the output is connected to the input of the above load gate or the load gates, hence to insert the guarding logic.

Figures 12A, 12B:
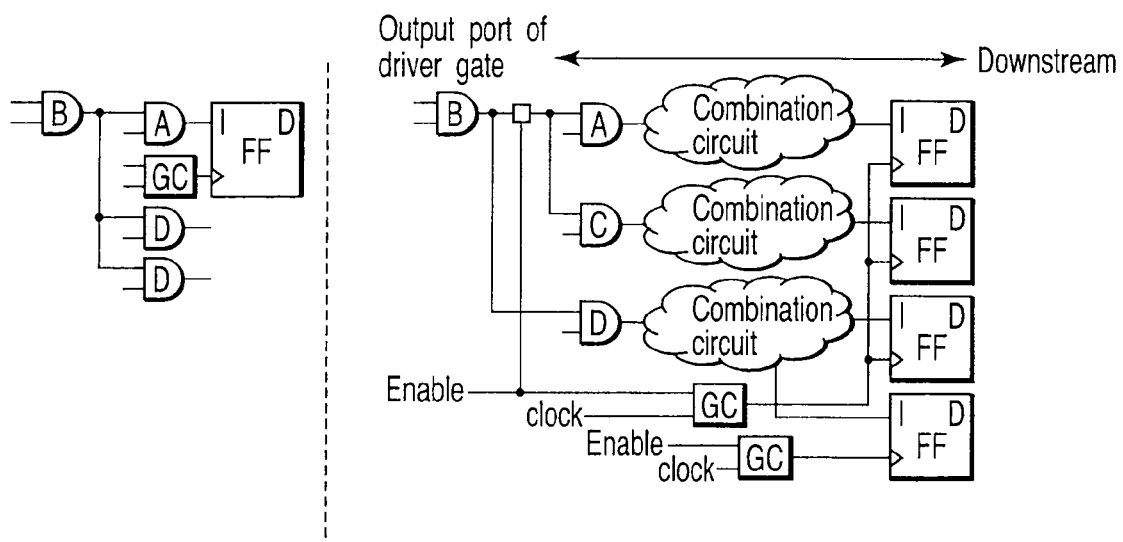
FIGS. 12A and 12B are circuit diagrams showing an example of the circuit designed according to the tenth embodiment.

A specific circuit example is shown in FIG. 12A. In FIG. 12A, the relation between the driver gate and the load gate from the view of the gate A is checked. From the view of the gate A, since the gate B is the driver gate and it also loads the gate C and the gate D in addition to the gate A, they are in the one to many relation.

At this time, the path passing through the gates C and D is checked downstream from the output terminal of the driver gate. As a result of the check, every FF which exists in the downstream path of the output terminal of the load gate C is driven by the same clock domain as that of the starting FF. On the other hand, the FFs which exist in the downstream path of the output terminal of the load gate D are driven by the clock domain different from that of the starting FF. The gate A and the gate C may be controlled together by the guarding logic (referring to FIG. 12B). The output line of the gate B is kept connected to the load gate D as it is.

By checking the clock control of the FF which exists in the downstream path of the load gate, the operation of the different clock domain is not interrupted. By making the guarding logic together as for the same clock domain, an increase in the circuit size can be suppressed.

The second example of the logic circuit will be described.

In the tenth embodiment, the case where "every FF which exists in the downstream path of the output terminal of the load gate is driven by the same clock domain as that of the starting FF" will be described.

The question why the guarding logic is inserted under the condition of not all will be described.

When the driver gate and the load gate are in the one to many relation and every FF which exists in the downstream path from the output terminal of every load gate which is loaded by the driver gate is driven by the same clock domain, it is not necessary to insert the guarding logic.

Figure 13:
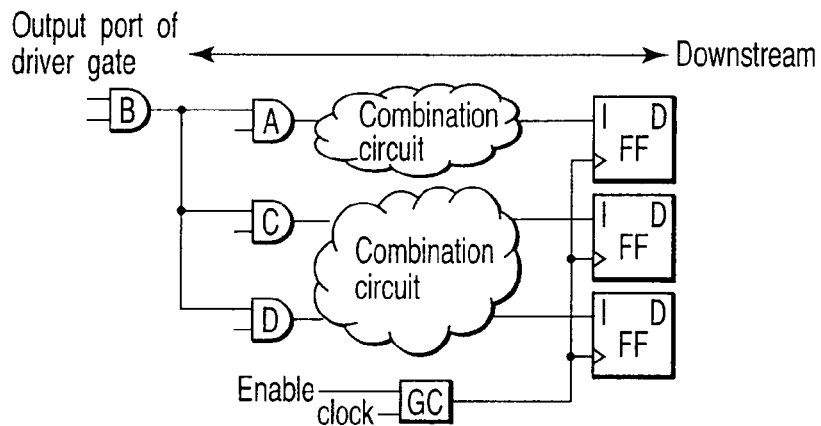
FIG. 13 is a circuit diagram showing an example of the circuit designed according to the tenth embodiment.

The specific circuit example is shown in FIG. 13. The relation between the driver gate and the load gate is checked from the view of the gate A. From the view of the gate A, since the gate B is the driver gate and it loads the gates C and D in addition to the gate A, they are in the one to many relation. At this time, when the path passing through the gates C and D downstream from the output terminal of the driver gate is checked, it is found that it is connected to all the FFs that are driven by the same clock.

In the case of this structure, it may result in the one to one relation. This is because the FF which uses the output of the gate B in the downstream end turns off the clock at the same timing and it is no problem to set the guarding logic in the front stage of the gate B. It may be recognized to be equivalent to the case of the "one to one" according to the ninth embodiment.

(Eleventh Embodiment)

Figure 14:
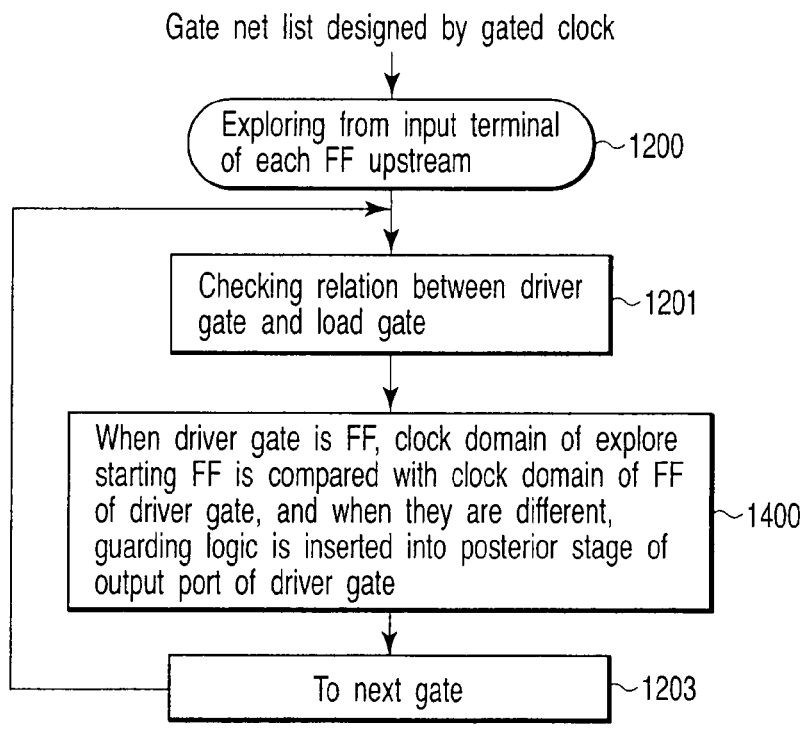
FIG. 14 is a flow chart showing an example of a circuit inserting method according to an eleventh embodiment of the invention.

FIG. 14 is a flow chart showing an example of a circuit inserting method according to an eleventh embodiment of the invention.

The eleventh embodiment is an example showing the guarding logic inserting condition according to the ninth embodiment more specifically.

As shown in the process 1400 in FIG. 14, when the driver gate is the FF, the clock domain of the explore starting FF is compared with the clock domain of the FF which is the driver gate. Only when they are different, the guarding logic is inserted between the output port of the driver gate and the load gate.

When the clock domains are the same, it is possible to stop the value by the gated clock. Therefore, guarding logic is not necessary and there is no increase in the circuit size.

(Twelfth Embodiment)

Figure 15:
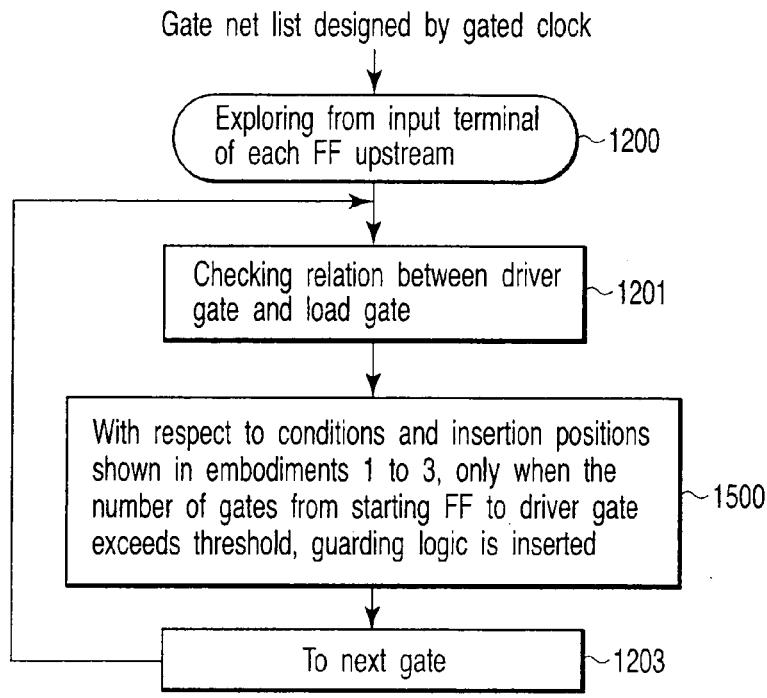
FIG. 15 is a flow chart showing an example of a circuit inserting method according to a twelfth embodiment of the invention.

FIG. 15 is a flow chart showing an example of a circuit inserting method according to a twelfth embodiment of the invention.

In the twelfth embodiment, another condition is added to the inserting conditions of the ninth to eleventh embodiments.

When the guarding logic is inserted according to the conditions described in the ninth to eleventh embodiments, as shown in the process 1500 of FIG. 15, the guarding logic is inserted only when the number of the gate stages from the explore starting FF to the driver gate exceeds a threshold (for example, 30 stages). The threshold is a parameter which a user may specify.

When the switching cannot be stopped for more than one stage even though the guarding logic is inserted, there is a problem that the overhead of the guarding logic cannot be disregarded. By stopping some gate stages collectively to a degree, the effect may be fully compensated on the insertion overhead of the guarding logic. In the flow chart, although "the number of the gate stages" is referred to, a black box may be substituted for the gate. In this case, the number of the gate stages may be counted by using the average number of the gate stages within the black box.

(Thirteenth Embodiment)

Figure 16:
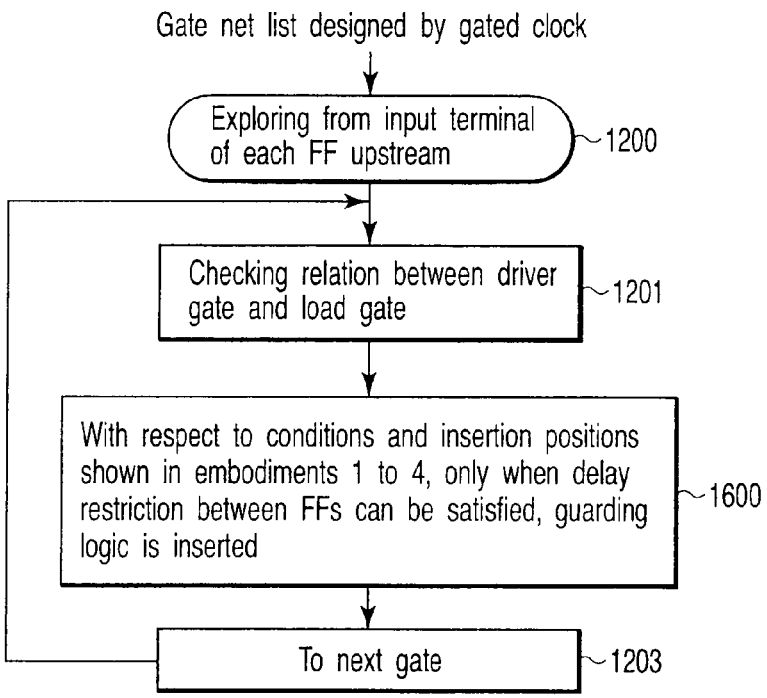
FIG. 16 is a flow chart showing an example of a circuit inserting method according to a thirteenth embodiment of the invention.

FIG. 16 is a flow chart showing an example of a circuit inserting method according to a thirteenth embodiment of the invention.

In the thirteenth embodiment, another condition is added to the inserting conditions in the ninth to twelfth embodiments.

Generally, when the logic synthesis is performed, a delay restriction is imposed on between the FFs. When the delay restriction is not satisfied, there is a problem that the operation of the circuit cannot be guaranteed. As shown in the process 1600 of FIG. 16, only when the delay restriction can be satisfied, the guarding logic is inserted. Therefore, the operation of the circuit can be guaranteed.

In the process of realizing the semiconductor integrated circuit devices according to the first to seventh embodiments, the device which inserts the guarding logic efficiently and mechanically is, for example, a circuit design supporting device which uses each of the circuit inserting methods according to the eighth to thirteenth embodiments as an algorithm.

In the circuit inserting method according to the eighth to thirteenth embodiments, there is a possibility that the wasteful circuit insertion may occur compared with the case of inserting the guarding logic by manual labor of an operator. As a specific example, a guarding logic may be inserted into the portion in which the Enable periods substantially overlap with each other, as shown in the lower left broken line frame of FIG. 6.

In short, the circuit 403 shown in FIG. 1 is the "circuit whose output never or seldom changes" and the circuit inserting method according to each of the eighth to thirteenth embodiments is the method for not inserting the guarding logic into only the "circuit whose output never changes". In other words, the circuit inserting methods according to each of the eighth to thirteenth embodiments is to stop the "circuit whose output seldom changes" by the guarding logic. Stopping the "circuit whose output seldom changes" by the guarding logic is no problem as the operation of the integrated circuit and it may be left as it is.

However, when a user wants to prevent the wasteful circuit insertion as much as possible, an alternation may be performed in the circuit inserting methods according the eighth to thirteenth embodiments so that the guarding logic is not inserted into the "circuit whose output never or seldom changes". In order to find the "circuit whose output seldom changes", for example, the circuit simulation is used at the same time to check the frequency of the output change in the circuit. In addition, a threshold is defined as for the frequency of the output change and when the frequency of the output change is no more than the threshold or less than the threshold, the circuit is determined as the "circuit whose output seldom changes". When the frequency of the output change is no more than the threshold or less than the threshold, the guarding logic may not be inserted or the inserted guarding logic may be taken out. By changing each of the eighth to thirteenth embodiments, such benefit that the wasteful circuit insertion can be suppressed may be obtained, in addition to the benefit obtained from the circuit inserting method according to each of the eighth to thirteenth embodiments such that the power consumption can be suppressed even with the circuit of the gated clock design. As mentioned above, the wasteful circuit insertion can be suppressed, which means that the production cost can be reduced and that a higher integration can be realized, in addition to a further decrease in the power consumption.

The embodiments includes the following aspects:

(1) A logic circuit comprising:

a clock generator (A) which generates a clock signal;

an Enable generator (B) which generates an on/off signal;

a clock controller (C) which receives the respective outputs of (A) and (B) and passes through the input from (A) only when the output of (B) is on;

a circuit (D) whose output never or seldom changes when the output of (B) is off;

a circuit (E) whose output frequently changes when the output of (B) is off;

an input controller (F) which receives the respective outputs of (E) and (B) and passes through the input from (E) only when the output of (B) is on;

a combination circuit (G) which receives the respective outputs of (D) and (F); and a memory (H) which receives the output of (G) and is driven by the output of (C).

According to the logic circuit of the aspect (1), when the clock controller stops the clock, the input controller fixes the value as for the input to the combination circuit whose value frequently changes and connects the input for the combination circuit whose value seldom changes to the combination circuit as it is. Generally the logic circuit has the spatial locality and the prior/posterior clock controls are close to each other, hence to lessen the number of the input lines requiring the input controllers more than the number of the input lines not requiring the input controllers. As a result, it is possible to efficiently reduce the wasteful power consumption occurring in the combinations circuits while restraining an increase in the circuit size.

(2) In the logic circuit according to the aspect (1), the input controller (F) is a logic circuit formed by an AND gate or an OR gate which receives the respective outputs of the circuit (E) and the Enable generator (B).

According to the logic circuit of the aspect (2), the AND gate and the OR gate are formed in the simple circuit structure and they may fix and pass through the value efficiently. As a result, it is possible to restrain an increase in the circuit size and path delay.

(3) In the logic circuit according to the aspect (1), the input controller (F) is a logic circuit formed by a latch circuit with Enable which receives the output of the circuit (E) and is controlled by the output of the Enable generator (B).

According to the logic circuit of the aspect (3), the latch circuit with the Enable is a circuit element which saves and fixes the value when the Enable signal is turned off. Since the output to the combination circuit does not change when the value is fixed, the power consumption at the time of fixing the value may be 0. In the logic circuit according to the aspect (2), since in the AND/OR gate, the output to the combination circuit is fixed at 0 or 1 when the value is fixed, there is a possibility that the driving power may occur in the combination circuit at the time of fixing the value.

(4) In the logic circuit according to the aspect (1), the circuit (D) is formed by such a feedback loop circuit that the output of the memory (H) is connected to the combination circuit (G) as it is, or a synchronization circuit driven by the output of the clock controller (C).

According to the logic circuit of the aspect (4), in the feedback loop circuit and the circuit sharing the clock controller, the output change of the circuit (D) becomes 0 when the Enable generator is turned off. Therefore, the combination circuit may be never driven, even without inserting the input controller. The low power consumption may be surely realized without an increase in the circuit size.

(5) In the logic circuit according to the aspect (1), the circuit (D) has a second Enable generator (I) which controls the clock of the circuit (D) and the period in which the respective outputs of the Enable generator (B) and the second Enable generator (I) are simultaneously turned off exceeds a certain threshold.

According to the logic circuit of the aspect (5), when the second Enable generator is almost turned off while the Enable generator is turned off, the output change in the circuit (D) is small while the Enable generator is turned off. Therefore, the combination circuit may be driven least without inserting the input controller. The low power consumption may be surely realized without an increase in the circuit size. The more agreement is found in the off periods of the Enable generator and the second Enable generator, the lower the power consumption becomes.

(6) According to the logic circuit of the aspect (1), the circuit (E) has a third Enable generator (J) which controls the clock of the circuit (E), the period in which the output of the Enable generator (B) is different from the output of the third Enable generator (J) exceeds a certain threshold, and the output line from the circuit (E) to the input controller (F) is connected to the other logic circuit within the circuit (E).

According to the logic circuit of the aspect (6), since the output of the circuit (E) is used by the other circuit during the period in which the Enable generator is turned off, the output change often occurs in the circuit (E). However, the input controller can stop the wasteful driving of the combination circuit, hence to realize the low power consumption.

When the third Enable generator is also turned off during the period in which the Enable generator is turned off, it is the same also in the logic circuit according to the aspect (4).

(7) A circuit inserting method including the following processes of:

(A) inputting the gate net list designed by the gated clock;

(B) exploring the circuit in the tree structure upstream starting from the data input terminal of the flip flop as the starting point for every flip flop within the gate net list, (C) finding a portion in which a downstream combination circuit cannot stop switching according to the gated clock design only, by checking the relation between a driver gate and a load gate from the view of each gate found in the tree structure; and (D) inserting the guarding logic which inputs the Enable control line of the gated clock of the flip flop as the starting point in the front stage of the combination circuit.

According to the circuit inserting method of the aspect (7), by inserting the guarding logic into only the portion in which the downstream combination circuit cannot stop switching only with the gated clock, the low power consumption may be realized while restraining an increase in the circuit size.

(8) In the circuit inserting method according to the aspect (7), when a driver gate and a load gate are in a one to many relation from the view of each gate found and when there exists one or more (but not all) load gates (F) such that every FF existing in the downstream path of the output terminal of the load gate is driven by the same clock domain as that of an explore starting FF, of all the load gates loaded by the driver gate, in the process (C), the output terminal of the driver gate is connected to the guarding logic and the output thereof is connected to the input of the above load gate (F), in the process (D).

According to the circuit inserting method of the aspect (8), by checking the clock control of the FF existing in the downstream path of the load gate, the operation of different clock domain is not interrupted. By getting together the guarding logic as for the same clock domain, it is possible to suppress an increase in the circuit size.

(9) In the circuit inserting method according to the aspect (7), when the driver gate from view of each gate found is the flip flop (G) and the clock domain of the flip flop (B) as the starting point in the aspect (1) is different from the clock domain of the flip flop (G) that is the driver gate, in the process (C), the guarding logic is inserted between the output port of the flip flop (G) that is the driver gate and the load gate, in the process (D).

According to the circuit inserting method of the aspect (9), when the clock domain of the flip flop as the starting point is different from the clock domain of the flip flop that is the driver gate, there is a possibility that the flip flop as the driver gate may operate during the period in which the flip flop as the starting point stops. By inserting the guarding logic, it is possible to stop the wasteful driving in the combination circuit.

(10) In the circuit inserting method according to the aspect (7), such a condition is added to the process (C) that only when the number of the gate stages from the flip flop (B) as the starting point to the driver gate exceeds a certain threshold.

According to the circuit inserting method of the aspect (10), when only one stage of the gates can be stopped even though the guarding logic is inserted, there is a problem that the overhead of the guarding logic is not negligible. By stopping the gates for some stages at once, the insertion overhead of the guarding logic can be fully compensated.

In the circuit inserting method of the aspect (7), such a condition is added to the process (C) that only when a delay restriction between the flip flops may be satisfied.

According to the circuit inserting method of the aspect (11), generally the delay restriction is imposed on between the FFs when the logic synthesis is performed. When the delay restriction cannot be satisfied, there is a problem that the operation of the circuit cannot be guaranteed. The guarding logic is inserted only when the delay restriction can be satisfied. Therefore, the operation of the circuit can be guaranteed.

The embodiments can provide a semiconductor integrated circuit device capable of saving the power consumption in spite of having a circuit designed by the gated clock and a circuit inserting method for obtaining this semiconductor integrated circuit device.

Each of the embodiments includes inventions of various stages and the inventions of various stages may be picked out by proper combination of several components disclosed in each of the embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for inserting a guarding logic into a circuit, comprising:

inputting, by a computer, a gate net list generated using a gated clock method, wherein the gated clock method controls a clock in all flip flops in the circuit;

exploring, by the computer, a circuit in a tree structure upstream starting from a data input terminal of one of the flip flops as a starting point, for every flip flop within the gate net list;

finding, by the computer, a portion in which a downstream combination circuit does not stop switching only according to a gated clock design, by checking a relation between a driver gate and a load gate from a view of each gate found in the tree structure to find a boundary between a first combination circuit and a second combination circuit, wherein an output terminal of the first combination circuit is connected only to a clock domain that controls the one of the flip flops as the starting point, and an output terminal of the second combination circuit is connected to clock domains including a clock domain that controls the one of the flip flops as the starting point; and in a front stage of the first combination circuit that corresponds to the boundary, inserting, by the computer, a guarding logic in which an Enable control line of the gated clock of the one of the flip flops as the starting point is input to the guarding logic.

2. The method according to claim 1, wherein when a driver gate and a load gate are in a one to many relation from a view of each gate found, and there exists at least one first load gate that comprises one of the flip flops existing in a downstream path of the output terminal driven by the clock domain that controls the one of the flip flops as the starting point, the guarding logic is connected to the output terminal of the driver gate and the output terminal of the driver gate is connected to the input of the load gate.

3. The method according to claim 1, wherein when the driver gate from a view of each gate found is another one of the flip flops and the clock domain of the one of the flip flops as the starting point is different from the clock domain of the another of the flip flops as the driver gate, the guarding logic is inserted between an output port of the another of the flip flops as the driver gate and the load gate.

4. The method according to claim 1, wherein, the finding a portion is further conditioned on only the number of gates from the one of the flip flops as the starting point to the driver gate exceeding a threshold.

5. The method according to claim 1, wherein, the finding a portion is further conditioned on only a delay restriction between a flip flop being satisfied.

* * * * *